United States Patent
Hussell

(10) Patent No.: US 9,461,024 B2
(45) Date of Patent: Oct. 4, 2016

(54) LIGHT EMITTER DEVICES AND METHODS FOR LIGHT EMITTING DIODE (LED) CHIPS

(71) Applicant: Cree, Inc., Durham, NC (US)

(72) Inventor: Christopher P. Hussell, Cary, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 13/956,814

(22) Filed: Aug. 1, 2013

(65) Prior Publication Data

US 2015/0034978 A1 Feb. 5, 2015

(51) Int. Cl.

| H01L 33/58 | (2010.01) |
|---|---|
| H01L 33/00 | (2010.01) |
| H01L 27/15 | (2006.01) |
| H01L 25/075 | (2006.01) |
| H01L 33/54 | (2010.01) |

(52) U.S. Cl.
CPC .......... H01L 25/0753 (2013.01); *H01L 33/54* (2013.01); *H01L 2224/48091* (2013.01); *H01L 2933/005* (2013.01)

(58) Field of Classification Search
CPC ........ H01L 33/58; H01L 33/00; H01L 27/15
USPC ............... 257/89, 93, 88, 91; 438/27, 26
See application file for complete search history.

(56) References Cited

U.S. PATENT DOCUMENTS

| 4,013,916 A | 3/1977 | Brown |
|---|---|---|
| 4,118,763 A | 10/1978 | Osteen |
| 4,143,394 A | 3/1979 | Schoberl |
| 4,300,185 A | 11/1981 | Wakamatsu |
| 4,464,707 A | 8/1984 | Forrest |
| 4,472,767 A | 9/1984 | Wenman |
| 4,946,547 A | 8/1990 | Palmour |
| 5,040,868 A | 8/1991 | Waitl |
| 5,200,022 A | 4/1993 | Kong |
| RE34,861 E | 2/1995 | Davis |
| 5,530,628 A | 6/1996 | Ngai |
| 5,690,415 A | 11/1997 | Krehl |
| 5,951,150 A | 9/1999 | Helstern |
| 6,061,160 A | 5/2000 | Maruyama |
| 6,350,041 B1 | 2/2002 | Tersa et al. |
| 6,376,902 B1 | 4/2002 | Arndt |

(Continued)

FOREIGN PATENT DOCUMENTS

| CN | 1380703 A | 11/2002 |
|---|---|---|
| CN | 1417868 A | 5/2003 |

(Continued)

OTHER PUBLICATIONS

U.S. Appl. No. 11/473,089, filed Jun. 21, 2006, Tarsa et al.

(Continued)

*Primary Examiner* — Sheng Zhu
(74) *Attorney, Agent, or Firm* — Jenkins, Wilson, Taylor & Hunt, P.A.

(57) ABSTRACT

Light emitter devices and methods are provided herein. In some aspects, emitter devices and methods provided herein are for light emitting diode (LED) chips, and can include providing a substrate and a plurality of LED chips over the substrate. The devices and methods described herein can further include providing a plurality of integral lenses over the LED chips, where at least some of the lenses can be distorted. In some aspects, the distorted lenses can be compressed towards each other along one or more directions.

32 Claims, 8 Drawing Sheets

(56) References Cited

U.S. PATENT DOCUMENTS

| | | |
|---|---|---|
| 6,435,697 B1 | 8/2002 | Simmons et al. |
| 6,457,844 B2 | 10/2002 | Hess |
| 6,521,915 B2 | 2/2003 | Odaki et al. |
| 6,536,924 B2 | 3/2003 | Segretto |
| 6,667,451 B1 | 12/2003 | Hart |
| 6,686,676 B2 | 2/2004 | McNulty et al. |
| 6,707,069 B2 | 3/2004 | Song et al. |
| 6,739,734 B1 | 5/2004 | Hulgan |
| 6,759,733 B2 | 7/2004 | Arndt |
| D494,550 S | 8/2004 | Hoshiba et al. |
| 6,900,511 B2 | 5/2005 | Ruhnau et al. |
| 6,914,194 B2 | 7/2005 | Fan |
| 6,940,704 B2 | 9/2005 | Stalions |
| D511,329 S | 11/2005 | Suenaga |
| D511,330 S | 11/2005 | Suenaga |
| D517,027 S | 3/2006 | Suenaga |
| 7,009,343 B2 | 3/2006 | Lim et al. |
| 7,048,416 B2 | 5/2006 | Clark et al. |
| 7,066,626 B2 | 6/2006 | Omata |
| 7,070,303 B2 | 7/2006 | Kassay et al. |
| 7,102,215 B2 | 9/2006 | Arndt |
| 7,131,747 B1 | 11/2006 | Yates |
| 7,183,632 B2 | 2/2007 | Arndt |
| 7,213,940 B1 | 5/2007 | Van De Ven |
| 7,217,023 B2 | 5/2007 | Iwasa et al. |
| 7,224,000 B2 | 5/2007 | Aanegola et al. |
| 7,228,253 B2 | 6/2007 | Chen et al. |
| 7,253,448 B2 | 8/2007 | Roberts et al. |
| 7,265,365 B2 | 9/2007 | Arvin et al. |
| 7,271,425 B2 | 9/2007 | Arndt et al. |
| 7,281,860 B2 | 10/2007 | Fujita |
| 7,282,785 B2 | 10/2007 | Yoshida |
| 7,317,181 B2 | 1/2008 | Murakami et al. |
| 7,344,952 B2 | 3/2008 | Chandra |
| 7,387,410 B2 | 6/2008 | Sibout |
| D572,210 S | 7/2008 | Lee |
| D576,574 S | 9/2008 | Kobayakawa |
| 7,514,279 B2 | 4/2009 | Ruhnau et al. |
| D591,697 S | 5/2009 | Andrews et al. |
| 7,540,627 B2 | 6/2009 | Handsaker |
| 7,614,759 B2 | 11/2009 | Nagley |
| 7,628,506 B2 | 12/2009 | Verfuerth |
| 7,654,703 B2 | 2/2010 | Kan |
| D615,504 S | 5/2010 | Keller et al. |
| 7,722,220 B2 | 5/2010 | Van de Ven et al. |
| 7,758,207 B1 | 7/2010 | Zhou |
| 7,762,692 B2 | 7/2010 | Lai et al. |
| 7,791,061 B2 | 9/2010 | Edmond |
| D631,020 S | 1/2011 | Chuang et al. |
| D633,631 S | 3/2011 | Shieh et al. |
| D634,863 S | 3/2011 | Leung et al. |
| 8,044,418 B2 | 10/2011 | Loh et al. |
| 8,047,673 B2 | 11/2011 | Santoro |
| 8,058,088 B2 | 11/2011 | Cannon |
| D650,342 S | 12/2011 | Kuwaharada et al. |
| D656,906 S | 4/2012 | Leung et al. |
| 8,206,004 B2 | 6/2012 | Serak et al. |
| D662,902 S | 7/2012 | Shieh et al. |
| 8,313,212 B1 | 11/2012 | Mayer et al. |
| 8,317,369 B2 | 11/2012 | McCanless |
| 8,342,714 B1 | 1/2013 | Rea et al. |
| 8,376,578 B2 | 2/2013 | Kong |
| 8,398,262 B2 | 3/2013 | Sloan et al. |
| 8,450,147 B2 | 5/2013 | Chandra |
| 8,459,824 B1 | 6/2013 | Esmailzadeh et al. |
| 8,523,383 B1 | 9/2013 | Grigore et al. |
| 8,714,770 B2 | 5/2014 | Kato et al. |
| 8,729,586 B2 | 5/2014 | Wu et al. |
| 8,764,220 B2 | 7/2014 | Chan et al. |
| 8,835,957 B2 | 9/2014 | Beppu et al. |
| 8,888,316 B2 | 11/2014 | Handsaker |
| 8,974,084 B2 | 3/2015 | Wildner |
| 9,028,120 B2 | 5/2015 | Dau et al. |
| 9,057,493 B2 | 6/2015 | Simon et al. |
| 2002/0123163 A1 | 9/2002 | Fujii |
| 2002/0163001 A1 | 11/2002 | Shaddock et al. |
| 2002/0163302 A1 | 11/2002 | Nitta et al. |
| 2003/0008431 A1 | 1/2003 | Matsubara et al. |
| 2004/0041222 A1 | 3/2004 | Loh |
| 2004/0079957 A1 | 4/2004 | Andrews et al. |
| 2004/0126913 A1 | 7/2004 | Loh |
| 2004/0130880 A1 | 7/2004 | Min et al. |
| 2004/0217364 A1 | 11/2004 | Tarsa et al. |
| 2004/0218390 A1 | 11/2004 | Holman et al. |
| 2004/0227149 A1 | 11/2004 | Ibbetson et al. |
| 2004/0238930 A1 | 12/2004 | Arndt |
| 2004/0240214 A1 | 12/2004 | Whitlow et al. |
| 2005/0073244 A1 | 4/2005 | Chou et al. |
| 2005/0073840 A1 | 4/2005 | Chou et al. |
| 2005/0173708 A1 | 8/2005 | Suehiro et al. |
| 2006/0049421 A1 | 3/2006 | Suehiro et al. |
| 2006/0049477 A1 | 3/2006 | Arndt et al. |
| 2006/0050505 A1 | 3/2006 | McCarthy et al. |
| 2006/0060882 A1 | 3/2006 | Ohe et al. |
| 2006/0097245 A1 | 5/2006 | Aanegola et al. |
| 2006/0097385 A1 | 5/2006 | Negley |
| 2006/0102917 A1 | 5/2006 | Oyama et al. |
| 2006/0124946 A1 | 6/2006 | Fujita |
| 2006/0186431 A1 | 8/2006 | Miki et al. |
| 2006/0273337 A1 | 12/2006 | Han et al. |
| 2006/0278882 A1 | 12/2006 | Leung et al. |
| 2006/0278886 A1 | 12/2006 | Tomoda et al. |
| 2006/0291185 A1* | 12/2006 | Atsushi ............................ 362/29 |
| 2007/0029569 A1 | 2/2007 | Andrews |
| 2007/0085107 A1 | 4/2007 | Nitta et al. |
| 2007/0108462 A1 | 5/2007 | Chua et al. |
| 2007/0158668 A1 | 7/2007 | Tarsa |
| 2007/0201225 A1 | 8/2007 | Holder et al. |
| 2007/0252250 A1 | 11/2007 | Hui et al. |
| 2007/0262339 A1 | 11/2007 | Hussell et al. |
| 2008/0128723 A1 | 6/2008 | Pang |
| 2008/0173884 A1 | 7/2008 | Chitnis |
| 2008/0179611 A1 | 7/2008 | Chitnis et al. |
| 2008/0258130 A1 | 10/2008 | Bergmann |
| 2008/0314944 A1 | 12/2008 | Tsai et al. |
| 2009/0040782 A1 | 2/2009 | Liu et al. |
| 2009/0046457 A1 | 2/2009 | Everhart |
| 2009/0050907 A1 | 2/2009 | Yuan et al. |
| 2009/0057699 A1 | 3/2009 | Basin |
| 2009/0091045 A1 | 4/2009 | Tanikawa et al. |
| 2009/0108281 A1 | 4/2009 | Keller et al. |
| 2009/0161356 A1 | 6/2009 | Negley et al. |
| 2009/0184333 A1 | 7/2009 | Wang et al. |
| 2009/0207602 A1 | 8/2009 | Reed et al. |
| 2009/0212304 A1 | 8/2009 | Wang et al. |
| 2009/0224265 A1 | 9/2009 | Wang et al. |
| 2009/0262515 A1 | 10/2009 | Lee et al. |
| 2009/0272995 A1 | 11/2009 | Ito et al. |
| 2009/0283781 A1 | 11/2009 | Chan et al. |
| 2009/0290345 A1 | 11/2009 | Shaner |
| 2009/0290348 A1 | 11/2009 | Van Laanen et al. |
| 2009/0296381 A1 | 12/2009 | Dubord |
| 2010/0002307 A1* | 1/2010 | Yamamura ..................... 359/626 |
| 2010/0002426 A1 | 1/2010 | Wu et al. |
| 2010/0142205 A1 | 6/2010 | Bishop |
| 2010/0155763 A1 | 6/2010 | Donofrio et al. |
| 2010/0171404 A1 | 7/2010 | Liu |
| 2010/0214770 A1 | 8/2010 | Anderson |
| 2010/0214785 A1 | 8/2010 | Chen |
| 2010/0220469 A1 | 9/2010 | Ivey et al. |
| 2010/0252851 A1 | 10/2010 | Emerson et al. |
| 2010/0259927 A1 | 10/2010 | Chien |
| 2010/0295070 A1* | 11/2010 | Su et al. ......................... 257/91 |
| 2010/0328945 A1 | 12/2010 | Song et al. |
| 2011/0001151 A1 | 1/2011 | Le Toquin |
| 2011/0006688 A1 | 1/2011 | Shim |
| 2011/0007514 A1 | 1/2011 | Sloan et al. |
| 2011/0013400 A1 | 1/2011 | Kanno et al. |
| 2011/0028006 A1 | 2/2011 | Shah et al. |
| 2011/0031527 A1 | 2/2011 | Kotani et al. |
| 2011/0090682 A1 | 4/2011 | Zheng et al. |
| 2011/0103043 A1 | 5/2011 | Ago et al. |
| 2011/0121331 A1 | 5/2011 | Simonian et al. |
| 2011/0140289 A1 | 6/2011 | Shiobara et al. |

(56) References Cited

U.S. PATENT DOCUMENTS

| | | |
|---|---|---|
| 2011/0149604 A1 | 6/2011 | Hussell et al. |
| 2011/0156061 A1 | 6/2011 | Wang et al. |
| 2011/0163683 A1 | 7/2011 | Steele et al. |
| 2011/0211330 A1 | 9/2011 | Wang |
| 2011/0215345 A1 | 9/2011 | Tarsa et al. |
| 2011/0220920 A1 | 9/2011 | Collins et al. |
| 2011/0221330 A1 | 9/2011 | Negley et al. |
| 2011/0228514 A1 | 9/2011 | Tong et al. |
| 2011/0285314 A1 | 11/2011 | Carney et al. |
| 2011/0286207 A1 | 11/2011 | Chan et al. |
| 2011/0286208 A1 | 11/2011 | Chen |
| 2011/0291131 A1* | 12/2011 | Ito ................................ 257/93 |
| 2011/0310604 A1 | 12/2011 | Shimizu et al. |
| 2011/0316006 A1 | 12/2011 | Xu |
| 2011/0316022 A1* | 12/2011 | Hussell ........................ 257/98 |
| 2012/0051041 A1 | 3/2012 | Edmond |
| 2012/0061703 A1 | 3/2012 | Kobayashi |
| 2012/0062821 A1 | 3/2012 | Takeuchi et al. |
| 2012/0068198 A1 | 3/2012 | Andrews et al. |
| 2012/0075857 A1 | 3/2012 | Verbrugh |
| 2012/0081883 A1 | 4/2012 | Wang |
| 2012/0098424 A1 | 4/2012 | Arik et al. |
| 2012/0120666 A1 | 5/2012 | Moeller |
| 2012/0169234 A1 | 7/2012 | Shew |
| 2012/0193651 A1 | 8/2012 | Edmond et al. |
| 2012/0218757 A1 | 8/2012 | Gill |
| 2012/0235190 A1 | 9/2012 | Keller et al. |
| 2012/0235199 A1 | 9/2012 | Andrews et al. |
| 2012/0250302 A1 | 10/2012 | Edwards et al. |
| 2012/0300456 A1* | 11/2012 | Phillips et al. ............... 362/245 |
| 2013/0050998 A1 | 2/2013 | Chu et al. |
| 2013/0094225 A1 | 4/2013 | Leichner |
| 2013/0271979 A1 | 10/2013 | Pearson et al. |
| 2013/0279180 A1 | 10/2013 | Pearson et al. |
| 2013/0329425 A1 | 12/2013 | Lowes et al. |
| 2013/0334559 A1 | 12/2013 | Vdovin et al. |
| 2014/0265809 A1 | 9/2014 | Hussell |

FOREIGN PATENT DOCUMENTS

| | | |
|---|---|---|
| CN | 1776506 A | 5/2006 |
| CN | 1802756 A | 7/2006 |
| CN | 1977399 | 6/2007 |
| EP | 0441622 A1 | 8/1991 |
| EP | 1187227 | 3/2002 |
| EP | 1529807 A2 | 11/2005 |
| EP | 2042528 A1 | 9/2007 |
| EP | 1953834 A1 | 8/2008 |
| EP | 2113949 A2 | 11/2009 |
| EP | 2149920 A1 | 2/2010 |
| EP | 2196501 A1 | 8/2010 |
| EP | 2336230 A1 | 6/2011 |
| JP | 2000188358 A | 7/2000 |
| JP | 2000223752 | 11/2000 |
| JP | 2001/301230 | 10/2001 |
| JP | 1171204 S | 4/2003 |
| JP | 2003197974 | 7/2003 |
| JP | 1218688 S | 9/2004 |
| JP | 2006165029 A | 6/2006 |
| JP | 2007287981 | 11/2007 |
| JP | 2007299905 | 11/2007 |
| KR | 300258101 | 5/2000 |
| KR | 3003875582 | 9/2005 |
| KR | 3003875583 | 9/2005 |
| KR | 300414267 | 5/2006 |
| KR | 100809658 | 3/2008 |
| TW | D112798 | 5/1989 |
| TW | D110647 | 10/2004 |
| TW | D109313 | 2/2006 |
| TW | D117563 | 6/2007 |
| TW | D123860 | 8/2008 |
| TW | D128141 | 4/2009 |
| TW | D158571 | 1/2014 |
| TW | D158573 | 1/2014 |
| WO | WO-2004053933 A2 | 6/2004 |
| WO | WO 2006/059828 | 6/2006 |
| WO | WO-2006060141 A2 | 6/2006 |
| WO | WO 2008/003289 A2 | 1/2008 |
| WO | WO-2011061650 A1 | 5/2011 |
| WO | WO 2012/120434 A1 | 9/2012 |
| WO | WO-2012128966 A3 | 9/2012 |

OTHER PUBLICATIONS

U.S. Appl. No. 11/656,759, filed Jan. 22, 2007, Chitnis et al.
U.S. Appl. No. 11/818,818, filed Jun. 2007, Chakraborty et al.
U.S. Appl. No. 11/895,573, filed Aug. 2007, Chakraborty et al.
U.S. Appl. No. 11/899,790, filed Sep. 7, 2007, Chitnis et al.
U.S. Appl. No. 12/002,429, filed Dec. 2007, Loh et al.
U.S. Appl. No. 12/463,709, filed May 11, 2009, Donofrio.
U.S. Appl. No. 12/475,261, filed May 2009, Nagley et al.
U.S. Appl. No. 12/498,253, filed Jul. 2009, Le Toquin et al.
U.S. Appl No. 12/717,048, filed Jun. 24, 2010, Donofrio.
U.S. Appl. No. 12/873,303, filed Aug. 31, 2010, Edmond et al.
U.S. Appl. No. 13/034,501, filed Feb. 24, 2011, Le et al.
U.S. Appl. No. 13/028,946, filed Feb. 16, 2011, Le et al.
U.S. Appl. No. 13/3452215, filed Jan. 2012, Lu et al.
Cree XLamp MC product info printout, from cree.com, 14 pages.
First OA from Chinese Pat App No. 20130052393.7 dated Jan. 9, 2014.
Nichia Corporation LEDs Models NSSM016G, NSSM227, NESM26X, NSSM026BB, NESM005A, 9 pages.
Notice of Allowance for Pat App No. 101307391 dated Oct. 15, 2013.
Exam Report for Pat App No. 102301478 dated Sep. 6, 2013.
Bergquist Co. Chanhassen Minn. "T-Clad" overview product sheet, 3 pages.
Citizen Micro HumanTech. "COB-High-wattage Series and Low-wattage Series."Short Form Lighting LED Catalog 2012. Citizen Electronics Co. Ltd. Japan. 7 pages.
Cree family of LED chips. DA, EZ, GaN, MB, RT,TR, UT, and XT. Printout from cree.com. 2 pages.
Cree XLampC family product info printout, from cree.com, 20 pages.
Cree XLampXM product info printout, from cree.com, 13 pages.
Non-Final OA for U.S. Appl. No. 13/051,894 dated Jan. 14, 2013.
Definition of 'composite', Oxford American English Dictonary, 2 pages, http://oxforddictionaries.com/us/definition/american_english/compsite?q=composite.
First Office Action from Chinese Design Patent appl. No. 201330524820.7 dated Feb. 20, 2014.
Non-Final Office Action from U.S. Appl. No. 29/424,353 dated Dec. 26, 2013.
International Search Report for PCT Patent Application No. PCT/US2012/028327 dated Nov. 23, 2012.
Final Office Action from U.S. Appl. No. 13/040,088 dated May 7, 2013.
Chinese Office Action for Patent Application No. 201210031021.0 dated Dec. 30, 2013.
Final Office Action for U.S. Appl. No. 13/051,894 dated Aug. 19, 2013.
Non-Final Office Action from U.S. Appl. No. 13/040,088 dated Sep. 13, 2013.
International Report on Patentability and Written Opinion for Application No. Application No. PCT/US2012/028327 dated Sep. 24, 2013.
Examination Report from Taiwanese Patent appl. No. 102308472 dated May 14, 2014.
Notice of Issuance of Chinese Patent Appl. No. 201430021459.0 dated May 21, 2014.
Second Office Action from Chinese Patent Appl. No. 201210031021.0 dated Jun. 4, 2014.
International Search Report and Written Opinion from PCT/US2013/062640 dated May 22, 2014.
Office Action from U.S. Appl. No. 13/051,894 dated Jun. 18, 2014.
Decision of Registration from Japanese Design Patent Application No. 2013-025955 dated Jun. 24, 2014.

(56) References Cited

OTHER PUBLICATIONS

Decision of Registration from Japanese Design Patent Application No. 2013-004502 dated Jun. 24, 2014.
Office Action from U.S. Appl. No. 13/649,067 dated Jul. 7, 2014.
Office Action from Korean Patent Design Appl. No. 30-2013-0010610 dated Jul. 8, 2014.
Examination and Search Report from Taiwanese Patent Appl. No. 103300731 dated Jul. 21, 2014.
Office Action from U.S. Appl. No. 13/649,052 dated Jul. 24, 2014.
International Search Report for Application No. PCT/US2014/045888 dated Sep. 11, 2014.
Non-Final Office Action from U.S. Appl. No. 13/770,389 dated Sep. 15, 2014.
Non-Final Office Action from U.S. Appl. No. 13/829,558 dated Sep. 30, 2014.
Final Office Action from U.S. Appl. No. 29/450,283 dated Nov. 5, 2014.
Final Office Action from U.S. Appl. No. 29/449,316 dated Nov. 26, 2014.
Non-Final Office Action from U.S. Appl. No. 13/840,812 dated Nov. 28, 2014.
Non-Final Office Action from U.S. Appl. No. 13/763,270 dated Oct. 3, 2014.
Non-Final Office Action for U.S. Appl. No. 13/672,592 dated Jan. 7, 2015.
Non-Final Office Action for U.S. Appl. No. 13/899,314 dated Jan. 15, 2015.
Non-Final Office Action for U.S. Appl. No. 13/958,461 dated Mar. 10, 2015.
Final Office Action for U.S. Appl. No. 13/842,150 dated Jan. 22, 2015.
Final Office Acrion for U.S. Appl. No. 13/829,558 dated Mar. 9, 2915.
Letter of Examination Report from Taiwanese Patent Application No. 101307391 dated Jun. 5, 2013.
Reasons for Rejection from Japanese Design Patent Application No. 2013/004502 dated Aug. 6, 2013.
International Preliminary Report on Patentability from PCT/US2012/028327, dated Oct. 3, 2013.
International Search Report for Application No. PCT/US2013/044277, dated Jan. 7, 2014.
Design of Registration Notice from Japanese Patent Application No. 2012/030304, dated Jan. 21, 2014.
Notice to Submit a Response from Korean Design Application No. 30-2012-0059744 dated Apr. 28, 2014.
Restriction Requirement for U.S. Appl. No. 13/839,130 dated Jul. 28, 2014.
International Search Report and Written Opinion from Application No. PCT/US2014/045888, dated Sep. 19, 2014.
Non-Final Office Action from U.S. Appl. No. 13/839,130 dated Sep. 25, 2014.
Final Office Action from U.S. Appl. No. 13/051,894 dated Dec. 12, 2014.
International Preliminary Report and Written Opinion from Application No. PCT/US2013/044277, dated Dec. 24, 2014.
Office Action for U.S. Appl. No. 13/958,462 dated Mar. 10, 2015.
Office Action from U.S. Appl. No. 13/770,389 dated Mar. 12, 2015.
Notice of Acceptance for Invalidation from Chinese Application No. 2007/10148327.3 dated Jan. 27, 2015 and Chinese version.
Chinese Office Action from Application No. 2012/10031021.0 dated Jan. 28, 2015.
Correction of Deficiencies notice from European Patent Application No. 13730742.7-1551 dated Feb. 3, 2015.
German Office Action for Application No. 10 2007 040 811.2 dated Feb. 12, 2015.
Office Action from U.S. Appl. No. 13/649,067 dated Feb. 18, 2015.
Non-Final Office Action for U.S. Appl. No. 13/834,605 dated Apr. 9, 2015.
International Search Report and Written Opinion for Application No. PCT/US2013/062640, dated Apr. 23, 2015.

Non-Final Office Action for U.S. Appl. No. 13/910,486, dated May 7, 2015.
Final Office Action for U.S. Appl. No. 13/840,812, dated May 15, 2015.
Final Office Action for U.S. Appl. No. 13/763,270, dated May 19, 2015.
CircalokTM conductive adhesive, 6972 and 6968, by Lord Corporation, 2 pages.
WhiteOpticstm White97 Film, Reflector Film Technical Data Sheet, WhiteOptics, LLc, New Castle.
Leviton LED Magnetic Tube Retrofit Series datasheet, 1 page, from www.leviton.com.
Office Action from U.S. Appl. No. 13/902,080, dated Jun. 2, 2015.
Office Action from U.S. Appl. No. 13/770,389, dated Jul. 1, 2015.
Decision to Grant from German Patent Application No. 10 2007 04 811.2, dated Jul. 3, 2015.
Fourth Office Action from Chinese Patent Application No. 201210031021.0, dated Jul. 16, 2015.
Non-Final Office Action for U.S. Appl. No. 14/252,685 dated Oct. 1, 2015.
Final Office Action for U.S. Appl. No. 13/910,486 dated Oct. 15, 2015.
Final Office Action for U.S. Appl. No. 13/958,461 dated Oct. 15, 2015.
Non-Final Office Action for U.S. Appl. No. 13/782,820 dated Oct. 30, 2015.
Non-Final Office Action for U.S. Appl. No. 13/899,314 dated Nov. 13, 2015.
Non-Final Office Action for U.S. Appl. No. 13/672,592 dated Nov. 23, 2015.
Non-Final Office Action for U.S. Appl. No. 14/020,750 dated Dec. 14, 2015.
Final Office Action from U.S. Appl. No. 13/899,314, dated Jul. 29, 2015.
Final Office Action from U.S. Appl. No. 13/672,592, dated Aug. 6, 2015.
Non-Final Office Action from U.S. Appl. No. 13/842,150, dated Aug. 10, 2015.
Non-Final Office Action from U.S. Appl. No. 13/829,558 dated Sep. 11, 2015.
Non-Final Office Action from U.S. Appl. No. 14/183,218, dated Aug. 10, 2015.
Non-Final Office Action from U.S. Appl. No. 13/051,894, dated Sep. 21, 2015.
Final Office Action from U.S. Appl. No. 13/902,080, dated Sep. 24, 2015.
Non-Final Office Action from U.S. Appl. No. 13/649,067, dated Oct. 1, 2015.
Non-Final Office Action from U.S. Appl. No. 13/770,389, dated Oct. 26, 2015.
Non-Final Office Action for U.S. Appl. No. 14/108,168 dated Dec. 24, 2015.
Final Office Action for U.S. Appl. No. 13/842,150 dated Dec. 30, 2015.
Notice of Allowance letter for Chinese Patent Application No. ZL201210031021.0 dated Jan. 5, 2016.
Non-Final Office Action for U.S. Appl. No. 13/763,270 dated Jan. 12, 2016.
Non-Final Office Action for U.S. Appl. No. 13/899,314 dated Feb. 4, 2016.
Non-Final Office Action for U.S. Appl. No. 14/070,098 dated Feb. 5, 2016.
Final Office Action for U.S. Appl. No. 13/829,558 dated Feb. 19, 2016.
U.S. Appl. No. 13/219,486, filed Aug. 2011, Ibbetson et al.
U.S. Appl. No. 13/306,589, filed Nov. 2011, Tarsa et al.
U.S. Appl. No. 13/368,217, filed Feb. 7, 2012, Pickard et al.
U.S. Appl. No. 13/544,662, filed Jul. 2012, Tarsa et al.
U.S. Appl. No. 13/770,389, filed Feb. 2013, Lowes et al.
U.S. Appl. No. 13/804,309, filed Mar. 2013, Castillo et al.
U.S. Appl. No. 13/842,307, filed Mar. 2013, Ibbetson et al.

(56) References Cited

OTHER PUBLICATIONS

U.S. Appl. No. 29/412,854, filed Mar. 2012, Leung et al.

* cited by examiner

LIGHT EMITTER DEVICES AND METHODS FOR LIGHT EMITTING DIODE (LED) CHIPS

TECHNICAL FIELD

The subject matter disclosed herein relates generally to light emitter devices and methods for light emitting diode (LED) chips. More particularly, the subject matter disclosed herein relates to batch processed light emitter devices having at least partially integral and/or distorted lenses, and related methods.

BACKGROUND

Light emitting diodes (LEDs) or LED chips are solid state devices that convert electrical energy into light. LED chips can be utilized in light emitter devices or components for providing different colors and patterns of light useful in various lighting and optoelectronic applications. Manufacturers of LED lighting products are constantly seeking ways to reduce their cost in order to provide a lower initial cost to customers, thereby encouraging the adoption of LED products. Manufacturers of LED lighting products are also constantly seeking ways to maintain and/or increase brightness levels while using the same or less power.

Conventional light emitter devices and methods utilize one or more LED chips that are either individually encapsulated or have individually molded lenses. Individually molding, encapsulating, and/or processing LED chips can be both expensive and time-consuming.

Accordingly, and despite the availability of various light emitter devices and components in the marketplace, a need remains for brighter and more efficient light emitter devices and methods that can be produced quickly and at a lower cost. Such devices can also make it easier for end-users to justify switching to LED products from a return on investment or payback perspective.

SUMMARY

In accordance with this disclosure, light emitter devices and related methods for light emitting diode (LED) chips are provided. Light emitter devices and methods described herein can advantageously exhibit improved brightness, light extraction processing times, and ease of manufacture. Such devices can also be provided at lower processing costs. Light emitter devices and related methods described herein can be well suited for a variety of applications such as personal, industrial, and commercial lighting applications including, for example, light bulbs and light fixture products and/or applications. It is, therefore, an object of the present disclosure to provide chip on board (COB) light emitter devices and methods having integrally formed lenses that are sized and/or shaped to provide brighter and more efficient LED products.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1A:
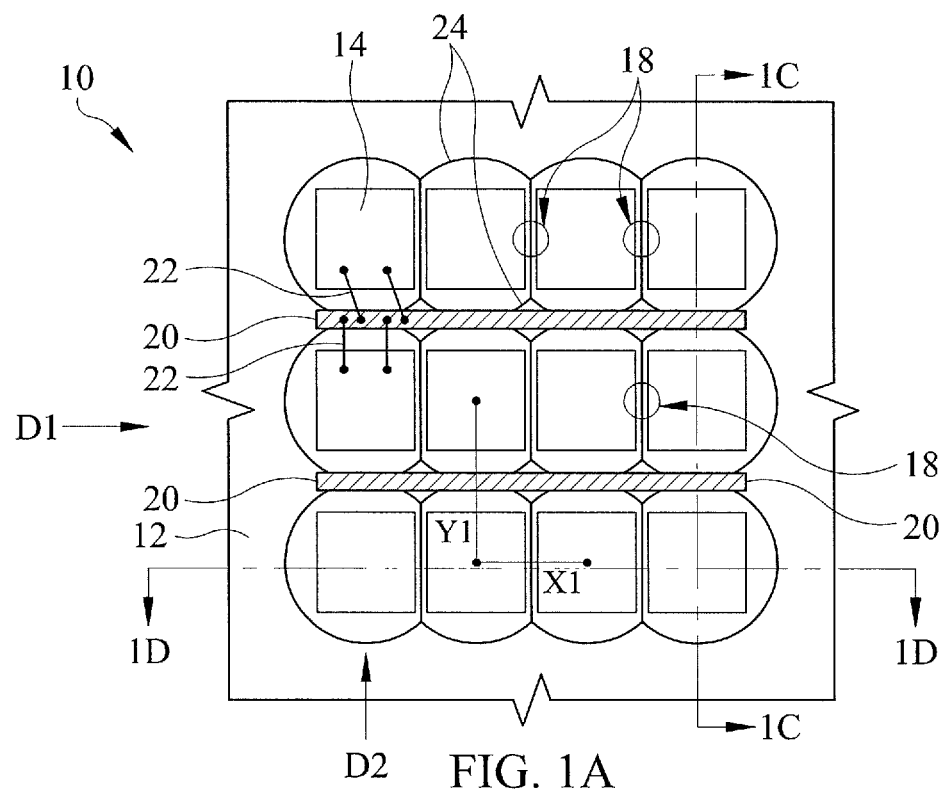
FIGS. 1A to 1E are various views illustrating light emitter devices and methods according to aspects of the disclosure herein.
Figure 1B:
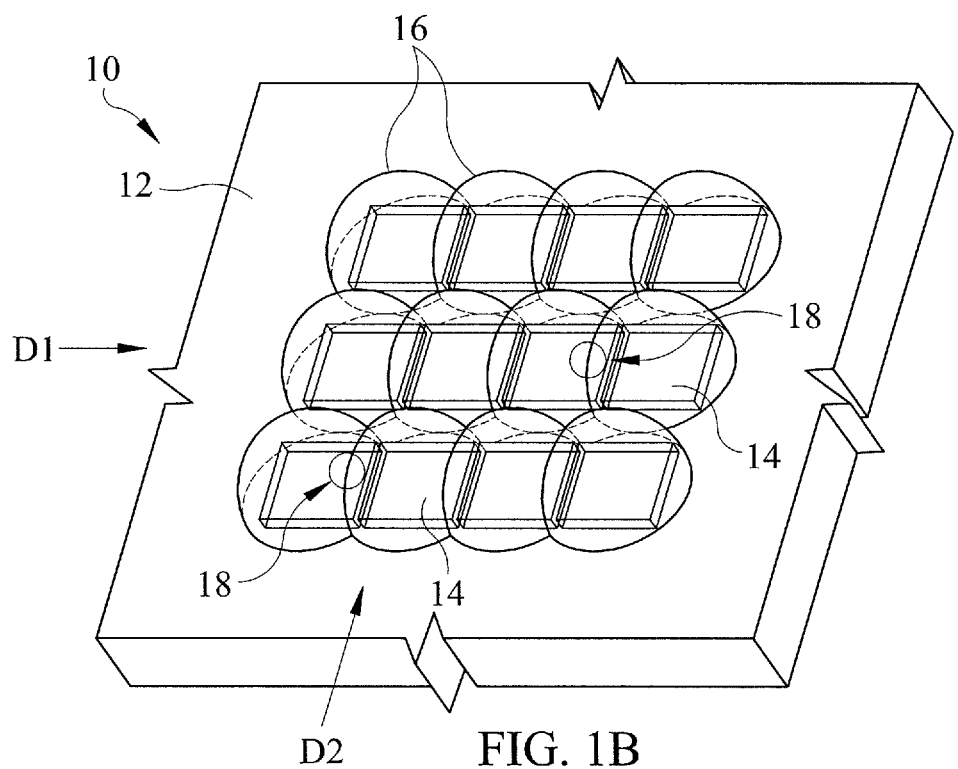

The subject matter disclosed herein is directed to light emitter devices and related methods for use with light emitting diode (LED) chips. In some aspects, emitter devices and related methods can be substrate based devices having chip on board (COB) LED chips, where the LED chips can be batch processed. Devices and methods provided herein can exhibit improved manufacturability as well increased light emission at a lower cost.

Notably, devices and related methods provided herein can comprise lenses that are distorted in at least one direction. For example, lenses can overlap and/or be compressed or stretched in at least one direction, such that each lens can comprise different widths in different directions. A period or repetition of each lens can be approximately the same size as and/or slightly larger than the size of LED chips provided below each lens. The novel chip spacing, lens spacing, and lens shape can contribute to devices having improved brightness and light extraction. LED chips can be die attached, wirebonded, and/or molded within a lens at a same time, thereby further improving processing times and/or costs.

In some aspects, devices and methods described herein comprise a substrate and multiple tightly packed LED chips provided over the substrate. Multiple LED chips per area provide a brightness and/or efficiency boost. Moreover, devices and methods described herein can comprise multiple domes that are distorted and/or intersect due to the size and packing density of the LED chips. Such domes can further improve the brightness and efficiency of each respective device, as curved domes can be brighter than a flat optic while also being mechanically more compact compared to a single large lens or a single optic provided over multiple chips.

Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices or components in the figures are rotated along an axis, structure or portion described as "above", other structures or portions would be oriented "next to" or "left of" the other structures or portions. Like numbers refer to like elements throughout.

As used herein, the terms "batch processing" or processing as a "batch" refer to performing a particular operation on a group of devices and/or LED chips at a same processing step and/or all at once, rather than manually performing the particular operation on each device or chip, one at a time and individually.

Unless the absence of one or more elements is specifically recited, the terms "comprising", including", and "having" as used herein should be interpreted as open-ended terms that do not preclude the presence of one or more elements.

Light emitter packages according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wirebonded. A vertical device (with or without the growth substrate) can have a first terminal (e.g., anode or cathode) solder bonded to a carrier substrate, mounting pad, or PCB and a second terminal (e.g., the opposing anode or cathode) wirebonded to the carrier substrate, electrical element, or PCB. Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

One or more LED chips can be at least partially coated with one or more phosphors. Notably, the LED chips can be coated with one or more phosphors prior to die attachment within the LED package. This can improve ease of manufacture and/or cost as other portions of the package aside from the LED chips do not need to have phosphor applied, and as the phosphor can be inexpensively applied, for example, by spraying the layer on prior to die attaching LED chips within package. The layer can be optionally roughened by grinding or other mechanical or chemical roughening process to improve light extraction and reflection.

In some aspects, the phosphors can absorb a portion of light from the LED chip and emit a different wavelength of light such that the light emitter package emits a combination of light from each of the LED chip and the phosphor. In one embodiment, the light emitter package emits what is perceived as white light resulting from a combination of light emission from the LED chip and the phosphor. In one embodiment according to the present subject matter, a white emitting package can consist of an LED chip that emits light in the blue wavelength spectrum and a phosphor that absorbs some of the blue light and re-emits light in the yellow wavelength spectrum. The package can therefore emit a white light combination of blue and yellow light. In other embodiments, the LED chips emit a non-white light combination of blue and yellow light as described in U.S. Pat. No. 7,213,940. LED chips emitting red light or LED chips covered by a phosphor that absorbs LED light and emits a red light are also contemplated herein.

LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. Pat. No. 8,058,088 entitled "Phosphor Coating Systems and Methods for Light Emitting Structures and Packaged Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties.

LED chips can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that light emitter packages and methods according to the present subject matter can also have multiple LED chips of different colors, one or more of which can be white emitting.

Referring now to FIGS. 1A to 1E, a light emitter device, generally designated 10, is illustrated in various views. In some aspects, light emitter device 10 can comprise a substrate 12 over which a plurality of LED chips 14 can be provided. In some aspects, a plurality of lenses 16 can be provided over substrate 12 and LED chips 14. Notably, the plurality of lenses 16 can be integrally formed (e.g., joined or formed together) and at least partially curved (e.g., non-flat). Lenses 16 can also be distorted in one direction and/or and at least a portion of some lenses 16 can overlap and/or intersect in at least one direction, for example, along direction D1 in portions or areas generally designated 18. In some aspects, portions or areas 18 comprise distorted portions or areas, in which adjacent lenses 16 are distorted in portions or areas where the lenses are adjacent another lens. In one aspect, lenses 16 can be distorted, such as towards each other, in those portions or areas. For example, in some aspects, lenses 16 can be distorted in or along first direction D1. Such lenses 16 can advantageously improve brightness and light extraction of device 10, while also improving ease of manufacture.

In some aspects, substrate 12 can comprise any material (s), size(s) and/or dimension(s). For example, in some aspects, substrate 12 can be substantially square, rectangular, circular, or any other suitable shape. Two or more LEDs chips 14 can be arranged in an array over substrate 12. In some aspects, a plurality of LED chips 14 can be arranged in one or more rows over substrate 12. LED chips 14 can be staggered in the rows and/or different rows can contain different (e.g., a variable) quantities of LED chips 14, such that LED chips 14 can form a predominantly square, rectangular, circular, or any other suitable shape of array. In some aspects, a square array of LED chips 14 can be provided over a rectangular substrate 12. In other aspects, a circular array of LED chips 14 can be provided over a circular substrate 12. Any size and/or shape of array and/or substrate 12 can be provided. Different sizes and/or shapes of arrays of LED chips 14 can advantageously be used for and/or to create different focusing optics where, for example, consumers or lighting designers desire different (e.g., narrow and/or wide) beam angles.

In some aspects, substrate 12 can comprise a single layer of material. In other aspects, substrate 12 can comprise multiple layers of at least two different materials, at least three different materials, or more than three different materials. For example, substrate 12 can comprise one or more layers of any one of an electrically conductive material, an electrically insulating material, a dielectric material, a ceramic material, a polymeric material, a plastic, a metal material, a metal alloy, and/or any combination(s) thereof. In some aspects, substrate 12 comprises a laminate material, a PCB, a MCPCB, a circuit, a flexible circuit, aluminum nitride (AlN), alumina ($Al_2O_3$) or any other suitable material. As FIG. 1D illustrates, substrate 12 can comprise multiple layers of material, generally designated I, II, III. In other aspects, substrate 12 can be more than or less than three layers.

Referring to FIGS. 1A to 1E in general and in some aspects, substrate 12 can comprise a length and a width that are equal. In other aspects, the length and width of substrate 12 can be unequal. In some aspects, a length and/or width of substrate 12 can comprise at least approximately 5 millimeters (mm) or more; approximately 10 mm or more; approximately 25 mm or more; approximately 50 mm or more; or more than approximately 50 mm. Substrate 12 can also comprise any suitable thickness, for example, a thickness of at least approximately 0.2 mm or more; approximately 0.5 mm or more; approximately 1 mm or more; approximately 5 mm or more; or more than approximately 5 mm. In some aspects, substrate 12 comprises a panel of material of any size and/or thickness. Notably, providing multiple LED chips 14 per area of substrate provides a brighter, more efficient device 10.

In some aspects, LED chips 14 can be provided in a tightly packed matrix or array over substrate 12. In some aspects, LED chips 14 can be arranged in columns and/or rows over substrate 12, and spaced apart at regular intervals or pitches. That is, in some aspects, LED chips 14 can have a same and/or equal pitch between adjacent LED chips 14 in all directions. In other aspects, LED chips 14 can be provided in staggered rows and/or have unequal pitches between adjacent LED chips 14 in one or more directions. LED chips 14 can comprise any size or dimension, for example, where at least one side (e.g., a length or a width) is at least approximately 200 micrometers ($\mu m$) or more (i.e., 0.2 millimeters (mm) or more); at least approximately 300 $\mu m$; at least approximately 500 $\mu m$; at least approximately 800 $\mu m$; at least approximately 1000 $\mu m$; or more than approximately 1000 $\mu m$ (i.e., 1 mm). In some aspects, LED chip 14 can comprise a 1.35×1.35 mm square chip. In other aspects, square and/or rectangular shaped chips of any size can be provided.

In some aspects, device 10 can comprise a chip on board (COB) device where LED chips 14 can be directly attached and/or mounted over substrate 12. This can contribute to improved brightness, light extraction, and/or cost per package or device by obviating the cost associated providing electrical vias or circuitry internally within portions of substrate 12. LED chips 14 can be batch die attached (e.g., via pick and place or similar techniques) over substrate 12 using any suitable material including, for example, an epoxy, solder, silicone, a flux material, an eutectic material, or any other suitable material. Each LED chip 14 can be adapted to emit light of approximately a same color and/or within a same primary wavelength range. In other aspects, LED chips 14 can be adapted to emit light that is at least two different colors, at least three different colors, or more than three colors. In some aspects, one or more LED chips 14 can emit light that is primarily white, primarily blue, primarily green, primarily red, cyan, yellow, orange, amber, and/or any combination(s) thereof.

Still referring generally to FIGS. 1A to 1E and in some aspects, at least some of the LED chips 14 can be wirebonded to traces 20 provided over substrate 12. In some aspects, each LED chip 14 can be wirebonded to at least one trace 20 via electrical connectors 22. The chips may also be electrically connected or bonded without wirebonds. For example, the anode and cathode can be bonded to traces or other structures on or associated with the LED chips without wirebonds. In some aspects, traces 20 can comprise an electrically conductive materiel, for example, a metal such as copper (Cu), aluminum (Al), tin (Sn), silver (Ag), gold (Au), alloys thereof, or any other suitable material adapted to pass electrical current into and out of LED chips 14. Traces 20 can be physically or chemically deposited, plated, stenciled, or otherwise provided over portions of substrate 12. Traces can be provided between adjacent rows of LED chips 14, such that the chips can be serially connected and/or connected in parallel therebetween. Combinations of serially connected and parallel connected LED chips 14 can be provided over substrate 12.

In some aspects, electrical connectors 22 can comprise electrically conductive wires or filaments of Au, Ag, Al, Sn, Cu, alloys thereof, or any other conductive material. Notably, the plurality of LED chips 14 can be die attached and wirebonded as a batch and at approximately the same time and/or during a same processing step. In some aspects, wirebonds and/or electrical connectors 22 may be obviated, as LED chips 14 can be directly attached to substrate 12 via contacts on a bottom surface thereof. Thus, in some aspects emitter device 10 may be fully or partially devoid of wirebonds (e.g., connectors 22) and/or traces 20.

As FIGS. 1A to 1E further illustrate, at least some lenses 16 of device 10 can be distorted where they are adjacent each other or towards each other, and they can overlap and/or intersect in such portions or areas of adjacent lenses 16 and along at least one direction as indicated by portions or areas 18. For example, portions of at least some lenses 16 can overlap and/or intersect along a first direction D1, which corresponds to a width along an x-axis of LED chips 14 and/or substrate 12. First direction D1 can be substantially orthogonal to a second direction D2, which corresponds to a second width and/or a length along a y-axis of LED chips 14 and/or substrate 12. Notably, each lens of the plurality of lenses 16 can be integrally formed and overlap in portions or areas 18 along direction D1. This can provide lenses 16 having different shaped cross-sections along different directions. For example, cross-sections along second direction D2 may be hemispherical and/or semicircular in shape while cross-sections along direction D1, which may be non-semicircular or non-hemispherical in shape. Such overlapping and integrated lenses 16 can advantageously increase light emission and light output from emitter device 10.

In some aspects, a period or width of each lens 16 in first and second directions D1 and D2 can be at least substantially the same as and/or wider than a width and/or length of LED chips 14 in the first and second directions D1 and D2, respectively. This can advantageously increase light extraction from emitter device 10.

Figure 1C:
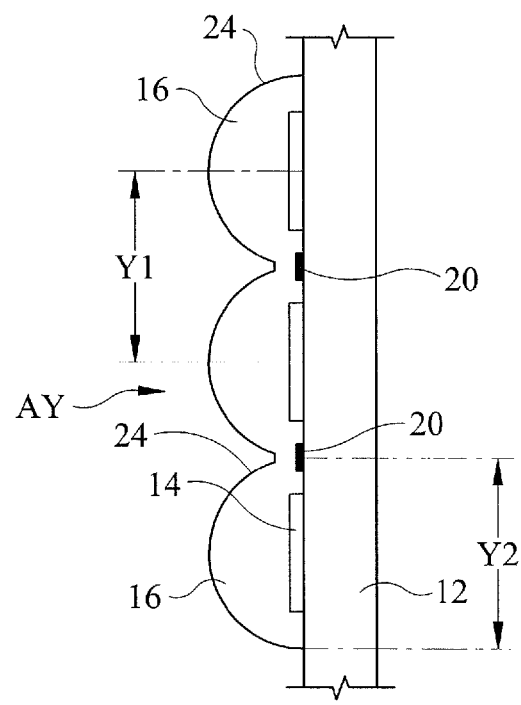
Figure 1D:
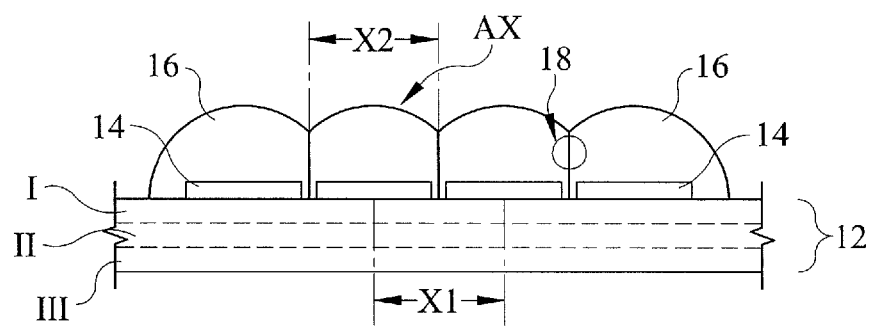

As FIGS. 1A, 1C and 1D illustrate, a first pitch between LED chips 14 in first direction D1, which corresponds to measurements along an x-axis, can be different (e.g., longer/shorter and/or larger/smaller) than a second pitch between LED chips 14 in second direction D2, which is substantially orthogonal to first direction D1 and which corresponds to measurements along a y-axis. For example, a first pitch generally designated X1, measures a distance between centerlines of LED chips 14 in first direction D1 and a second pitch generally designated Y1, measures a distance between centerlines of LED chips 14 in second direction D2. In some aspects, first pitch X1 can be shorter and/or smaller than second pitch Y1, and vice versa. In further aspects, first pitch X1 can be longer and/or larger than second pitch Y1, and vice versa.

For example only and without limitation, in some aspects first pitch X1 can comprise approximately 1.51 mm and second pitch Y1 can comprise approximately 2.2 mm in the y-direction or along the y-axis. Notably, at least some of the domes or lenses 16 can be distorted (e.g., stretched and/or compressed) in at least one direction and at least along one axis to increase brightness. In some aspects, a diameter of each dome or lens can be approximately 2.2 mm and non-intersecting in the y-direction, and smaller in the x-direction.

As FIGS. 1C and 1D illustrate, integral and at least partially curved or domed lenses 16 can be provided over LED chips 14 having different pitches X1 and Y1 therebetween. The domes and/or lenses 16 can comprise a same height, and can be mechanically more compact than a single large dome or lens. In some aspects, each dome or lens 16 can be centrally disposed over each LED chip 14. In other aspects, LED chips 14 can be offset below respective lenses 16, or non-centrally disposed with respect to an apex (e.g., maximum height) of respective lenses 16. At least some of the lenses 16 can be substantially the same as and/or or slightly larger in overall length or width than first pitch X1 while also being substantially the same as and/or slightly larger in overall length or width than second pitch Y1. That is, a period of each dome or lens in each the x- and y-directions can be approximately the same as and/or slightly larger than the underlying LED chips 14.

Referring to FIG. 1A, light emitter device 10 can comprise lenses 16 having portions or areas 18 therebetween that are distorted. As FIG. 1A illustrates, such portions or areas 18 can be linear (e.g., vertical lines). Notably, lenses 16 can be bounded by one or more linear surfaces (e.g., proximate portions or areas 18) and one or more curved surfaces 24. As FIGS. 1D and 1D illustrate, linear surfaces (e.g., compressed surfaces or portions or areas between adjacent lenses 16) can be elevated over substrate 12, and curved surfaces 24 can be disposed directly on substrate 12. In other aspects, curved surfaces 24 can also be elevated over substrate 12 as seen in FIG. 1C.

Notably, as FIGS. 1C and 1D illustrate, some lenses 16 can comprise different widths in different directions and/or along different axes (e.g., different widths along the x- and y-axes). For example, some lenses 16 can comprise a first maximum width generally designated X2 (FIG. 1D) along first direction D1 and a second maximum width generally designated Y2 (FIG. 1C) along second direction D2. In some aspects, first width X2 can be different than second width Y2. That is, first width X2 can be smaller (e.g., shorter) or larger (e.g., longer) than second width Y2. In some aspects, at least one width (e.g., first width X2) of one or more lenses 16 can be smaller than second width Y2 that is substantially orthogonal to the at least one width. In some aspects, the second maximum width Y2 of at least some of the lenses 16 can comprise a diameter of a sphere. In some aspects, the first maximum width X2 of at least some of the lenses 16 can be less than a diameter of a sphere.

As the cross-sectional views in FIGS. 1C and 1D illustrate, some lenses 16 can comprise a distorted shape, for example having at least a substantially semicircular or hemispherical shaped cross-sectional shape in one direction (e.g., direction D2 (y-axis), FIG. 1C), and a more compressed shaped lens of a non-hemispheric shape in another, substantially orthogonal direction (e.g., D1 (x-axis), FIG. 1D). As FIG. 1D illustrates, the plurality of lenses 16 can be integrally formed such that some of the lenses are compressed against each other and/or overlap or along first direction D1, as shown by portions or areas 18, such that in direction D1 some lenses 16 are smaller than hemispheric (e.g., of smaller width X2) having an angle less than 180° between overlapping portions or areas 18 (e.g., where adjacent lenses become compressed and/or intersect). Notably, the maximum diameters (e.g., X2, Y2) of respective lenses 16 in each direction are larger than the underlying chip 14 dimensions. This can maximize light extraction per LED chip 14, thereby providing a brighter device.

In some aspects, as seen in FIGS. 1C and 1D, emitter device 10 can comprise one or more lenses 16 comprising a dome. The dome can be comprised a first arc AY (FIG. 1C) and a second arc AX (FIG. 1D). First and second arcs AY and AX, respectively, can be substantially orthogonal (e.g., AY is along D2 and AX is along D1) and each can comprise a different length. In some aspects, a length of arc AY can be wider than the width of a chip 14 and/or pitch between LED chips 14, and can comprise a length between one or more traces 20. In some aspects, a length of arc AX can comprise a length substantially the same as and/or slightly wider than a width of an LED chip 14 and/or a pitch between LED chips 14.

Figure 1E:
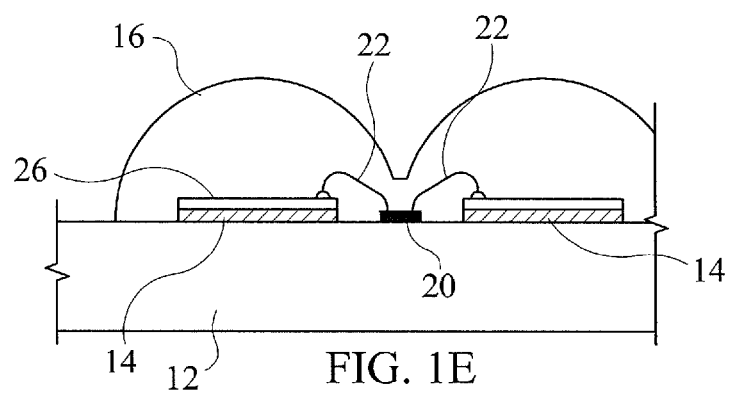

As FIGS. 1A and 1E further illustrate, at least some LED chips 14 can optionally be wirebonded to portions of traces 20. LED chips 14 can be electrically connected in series, parallel, or combinations thereof. As FIG. 1E further illustrates, in some aspects LED chips 14 can be coated with a layer of wavelength conversion material 26 prior to the processing steps of die attach and/or wirebonding. In some aspects, LED chips 14 can be coated with a wavelength conversion material comprising a phosphor prior to singulation of individual LED chips from a wafer. In other aspects, LED chips 14 can be coated with a layer of phosphor after singulation from a wafer.

FIGS. 2A to 2D illustrate another embodiment of a light emitter device, generally designated 30. Light emitter device 30 can comprise a plurality of LED chips 14 provided over a substrate 12 as previously described. A plurality of integrally formed lenses 16 can be provided over the plurality of LED chips 14. Portions of the lenses 16 can overlap in at least one direction as indicated by portions or areas 18, such that a width of the lenses 16 can be different in one direction than in another direction. That is, in some aspects, lenses 16 can be distorted in one direction. For example, at least some of the lenses 16 can be compressed, overlap, intersect, and/or have a smaller width (X2, FIG. 1D) in first direction D1 than in second direction D2. In some aspects, the maximum widths of lenses in first and second directions D1 and D2, respectively, can be substantially the same as and/or wider than each underlying LED chip 14. At least some of the LED chips 14 can be electrically connected to traces 20 via electrical connectors or wirebonds 22. In other aspects, devices described herein can comprise horizontally structured LED chips 14 having contacts on a bottom side, thereby being devoid of wirebonds.

Figure 2A:
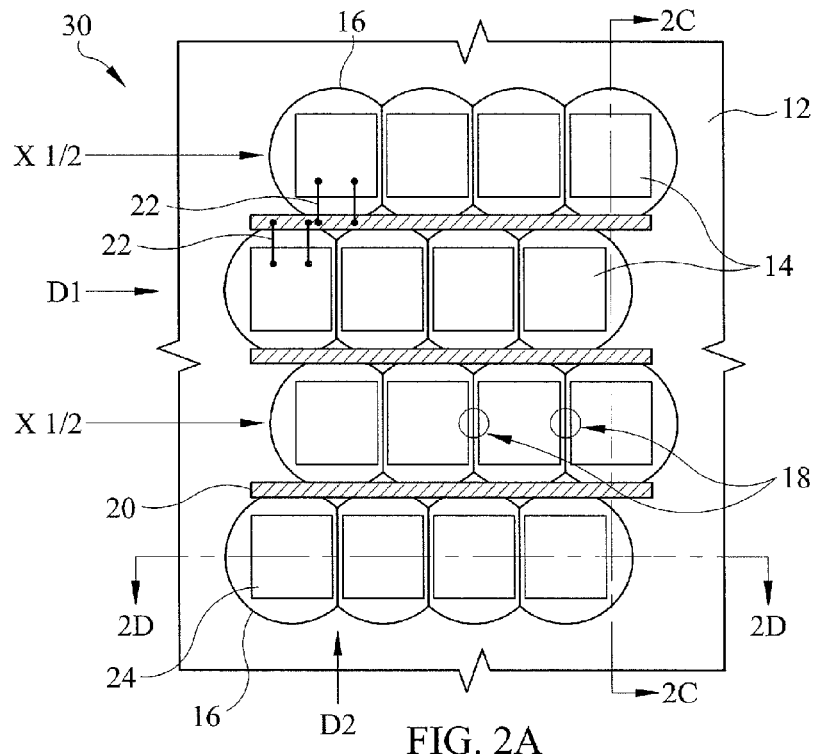
FIGS. 2A to 2D are various views illustrating light emitter devices and methods according to further aspects of the disclosure herein.
Figure 2B:
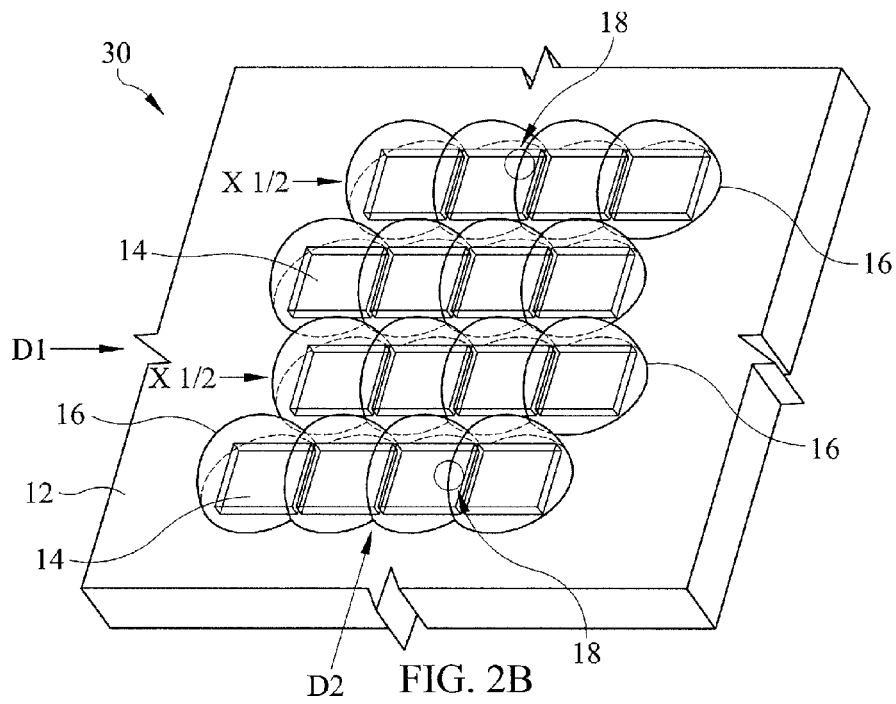
Figure 2C:
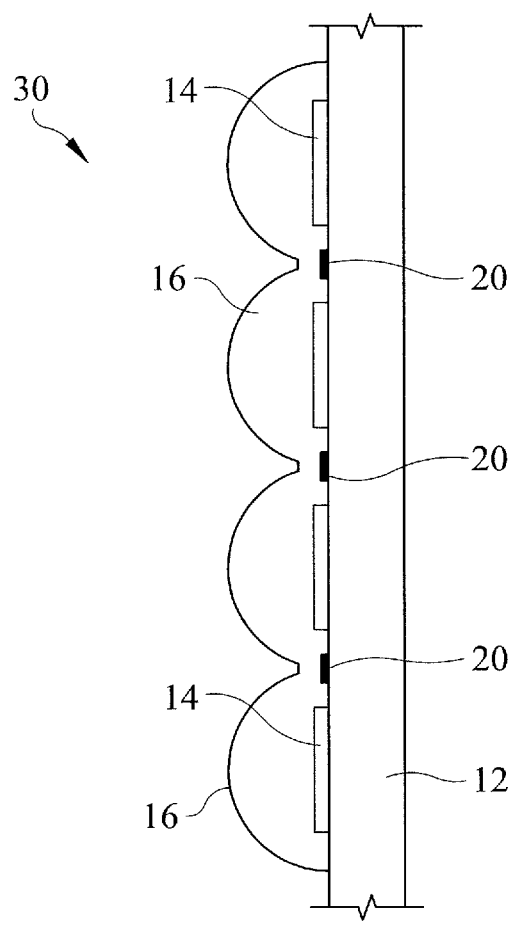
Figure 2D:
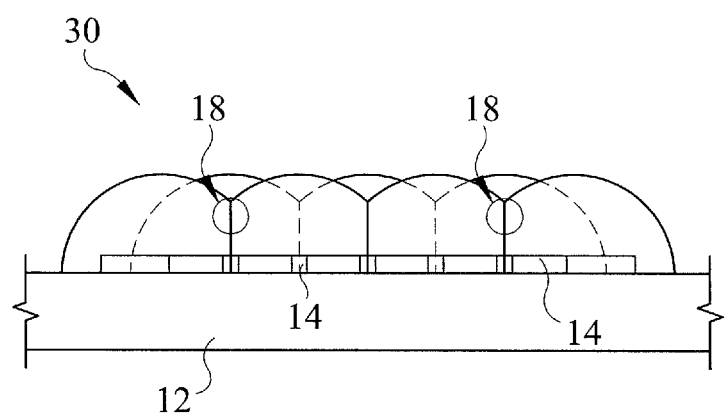

Notably, device 30 can comprise multiple rows of LED chips 14 provided in an array. At least some rows of the array of LED chips 14 can be offset or staggered in at least one direction. For example, the array of LED chips 14 can be offset by a dimension of X1/2, where X1 is the pitch of the LED chips in the first direction D1 or along the x-axis. As FIGS. 2A to 2D illustrate, LED chips 14 and lenses 16 can be offset in direction D1 by one-half of the pitch between LEDs in first direction D1. Offsetting LED chips 14 can contribute to improved light extraction and/or light saturation. It can also provide desired beam patterns. As FIGS. 2A and 2B illustrate, LED chips 14 can be provided in a non-square or staggered array. Lenses 16 therefore can intersect in first direction, D1. FIGS. 2C and 2D illustrate the curved domes having variable widths in variable directions.

Figure 3:
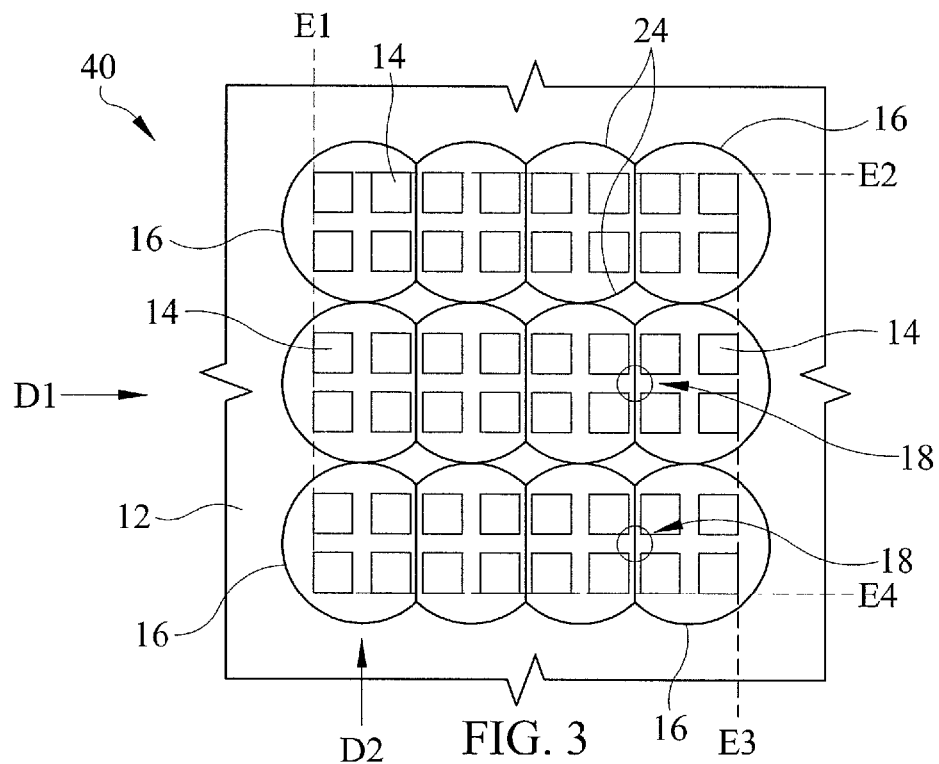
FIGS. 3 to 6 are top plan views illustrating light emitter devices and methods according to further aspects of the disclosure herein.
Figure 4:
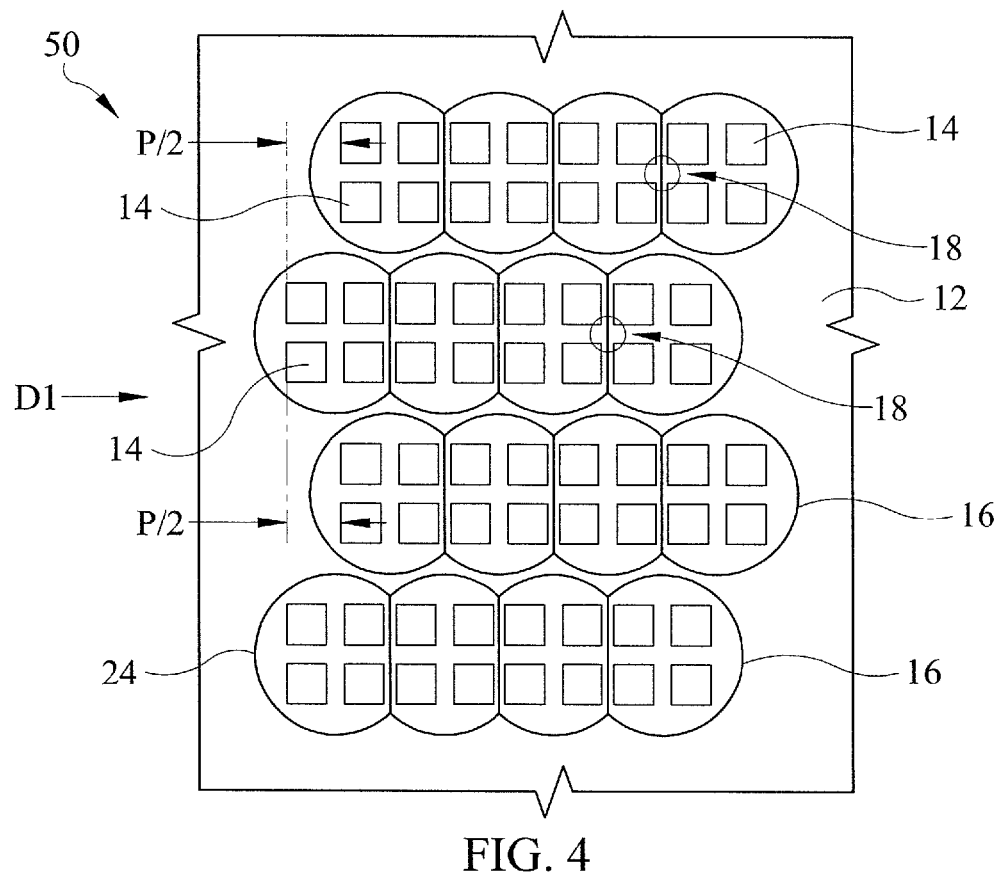

Referring to FIGS. 3 and 4, further aspects of light emitter devices and related methods are provided. Referring to FIG. 3, in some aspects a plurality of LED chips 14 can be provided below each respective lens 16 of the plurality of lenses. LED chips 14 can be any size, shape, build, and/or color. LED chips can also be spaced apart at any pitch. In some aspects, each LED chip 14 can be approximately a same color or selected from a same targeted wavelength bin. In other aspects, LED chips 14 can provided in two or more different colors and/or selected from different targeted wavelength bins.

Groups of LED chips 14 provided below each lens 16 can be connected in series, parallel, and/or combinations thereof. LED chips 14 can be electrically attached to the substrate via bottom electrical contacts, or LEDs 14 can be wirebonded to one or more electrical traces (e.g., see FIGS. 1A to 1E). The plurality of LED chips 14 provided below each lens 16 can be centrally disposed below an apex (e.g., maximum height) of each domed lens 16, or LED chips 14 can be offset and non-centrally disposed below the apex of each domed lens 16. Any arrangement is contemplated, and can be provided herein. Notably, the period of each lens 16 in each direction can be approximately the same size and/or slightly larger than each group of LED chips 14 provided there below. This can contribute to an improved light extraction per device 20.

As FIGS. 3 and 4 further illustrate, at least some of the plurality of lenses 16 can be distorted along at least one direction. For example, lenses can be compressed and/or stretched along at least one direction. In some aspects, lenses 16 can be compressed, intersect, and/or overlap along first direction D1 such that a maximum width of some lenses 16 along the first direction D1 can be less than (i.e., shorter than) a maximum width in second direction D2. Lenses 16 can be provided at a same molding step via a same molding block, thereby contributing to improved light extraction and brightness. As FIG. 3 illustrates, the array of LED chips 14 can be provided in a substantially square array such that LED chips 14 are substantially aligned along four edges, generally denoted E1, E2, E3, and E4. As FIG. 4 illustrates, in some aspects, LED chips 14 can be staggered in a non-square array with respect to one or more edges E1, E2, E3, and/or E4.

Referring now to FIG. 4, one or more rows of LED chips 14 can be offset and/or staggered with respect to other rows of LED chips 14. In some aspects, the rows of LED chips can be offset by approximately one-half of a pitch (i.e., P/2) between groups of LED chips 14. That is, one group of multiple groups of LED chips 14 can be provided below each individual lens of the plurality of lenses 16. Each group of LED chips 14 can be spaced apart at a pitch P. As FIG.

4 illustrates, some rows of LED chips 14 can be offset by one-half the pitch P, or P/2. The rows of LED chips 14 and respective lenses 16 can be provided in alternating staggered or offset rows. This can provide improved light extraction and/or variable beam patterns.

Figure 5A:
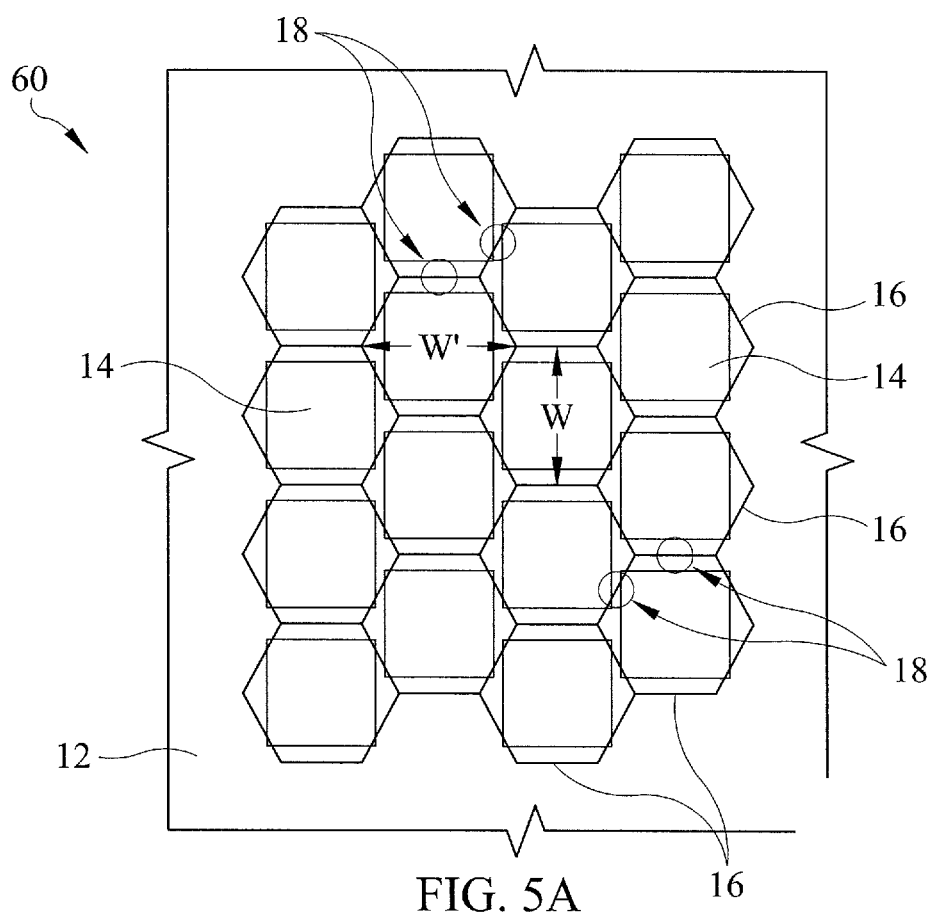
Figure 5B:
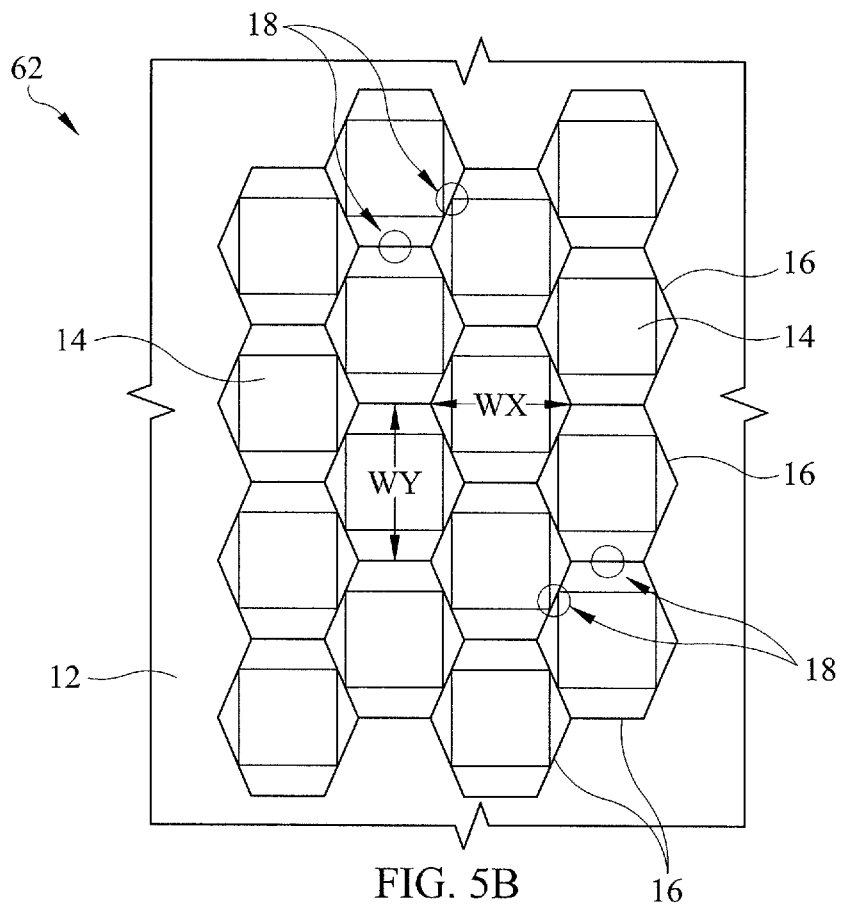

FIGS. 5A and 5B illustrates a further aspect of light emitter devices, generally designated 60 and 62. In some aspects, lenses 16 can be integrally formed in a honeycomb pattern having hexagonally shaped lenses 16. That is, by shifting every-other row of LED chips 14, a honeycomb pattern of lenses 16 can be provided. One or more chips 14 can provided centrally below a center of each hexagonally shaped lens 16. In some aspects as illustrated in FIG. 5A, each lens 16 can be compressed in each direction, such that each lens 16 can comprise a maximum width W and W' in each direction that can be less than a diameter of a sphere. In other aspects as illustrated in FIG. 5B, a distorted honeycomb pattern can be provided, where the honeycomb pattern can be stretched or compressed in one direction with respect to another direction, having different widths WX and WY. This can advantageously allow for a maximum packing density of LED chips 14 below lenses 16 with minimum intersection, thereby improving brightness.

In some aspects, any size and/or shape of LED chips 14 can be provided. For example only and without limitation, in some aspects, LED chips 14 can comprise a length and a width of approximately 1.35 mm. A ratio of row pitch to column pitch can be approximately 1.15 in FIG. 5A. The plurality of lenses 16 can be integrally formed and have some curvature such that top surfaces of lenses are non-flat or slightly curved. As noted above and as illustrated in FIG. 5B, the lenses 16 can be compressed or stretched thereby forming a distorted honeycomb, where at least some of the hexagonal sides are different lengths. In some aspects, lenses 16 comprise distorted portions or areas 18 in which adjacent lenses 16 are distorted in portions or areas 18 between adjacent lenses 16. In some aspects, lenses 16 can be distorted in a first direction.

Figure 6:
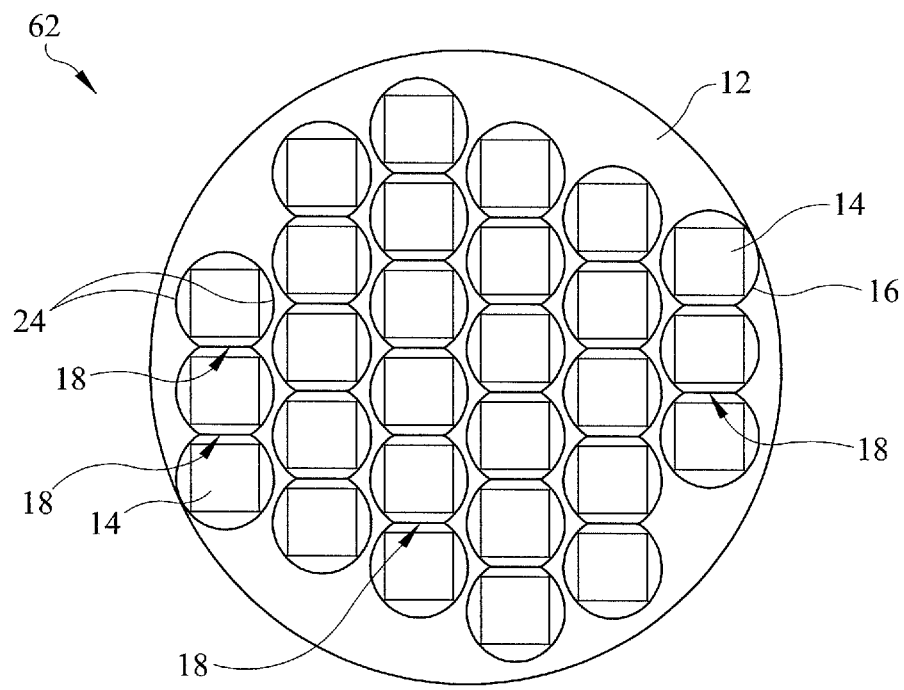

FIG. 6 illustrates a further aspect of a light emitter device, generally designated 70. Emitter device 70 can comprise substrate 12, two or more LED chips 14 and lenses 16 provided over one or more LED chips 14. At least one LED chip 14 can be centrally or non-centrally disposed below each lens 16. Notably, substrate 12 can comprise any non-rectangular or non-square shape, such as for example a circle. LED chips 14 can be arranged in an array comprising one or more rows over substrate 12. Notably, one or more rows of the array can contain different quantities of LED chips 14. That is, in some aspects, LED chips 14 can be arranged in a substantially circular array over a substantially circular substrate 12. Any other suitable combinations of array shape and/or substrate shape can be provided. This can be useful to consumers by allowing different beam patterns, beam directions, and/or beam angles to be achieved.

As FIG. 6 further illustrates, adjacent lenses 16 can be distorted as indicated by portions or areas 18. That is, in some aspects, lenses 16 can be compressed and/or stretched, such as towards each other, in a direction. Notably, lenses 16 can comprise domes bounded by linear and curved surfaces, which can increase light extraction by allowing formation of integral lenses over tightly packed arrays of LED chips. For example some lenses can be bounded by distorted portions or areas 18 comprising linear surfaces or areas. Adjacent boundaries between distorted portions or areas 18 can comprise curved surfaces 24 or areas. Some lenses 16 can comprise a dome comprising different arc lengths, where one arc is approximately the width of at least one LED chip 14, or slightly wider, and another arc is orthogonal to the one arc, and is longer than the one arc (see e.g., FIGS. 1C and 1D). This can advantageously allow lenses to be provided over closely packed LED chips 14, thereby maximizing light extraction and brightness from emitter device 70.

Figure 7:
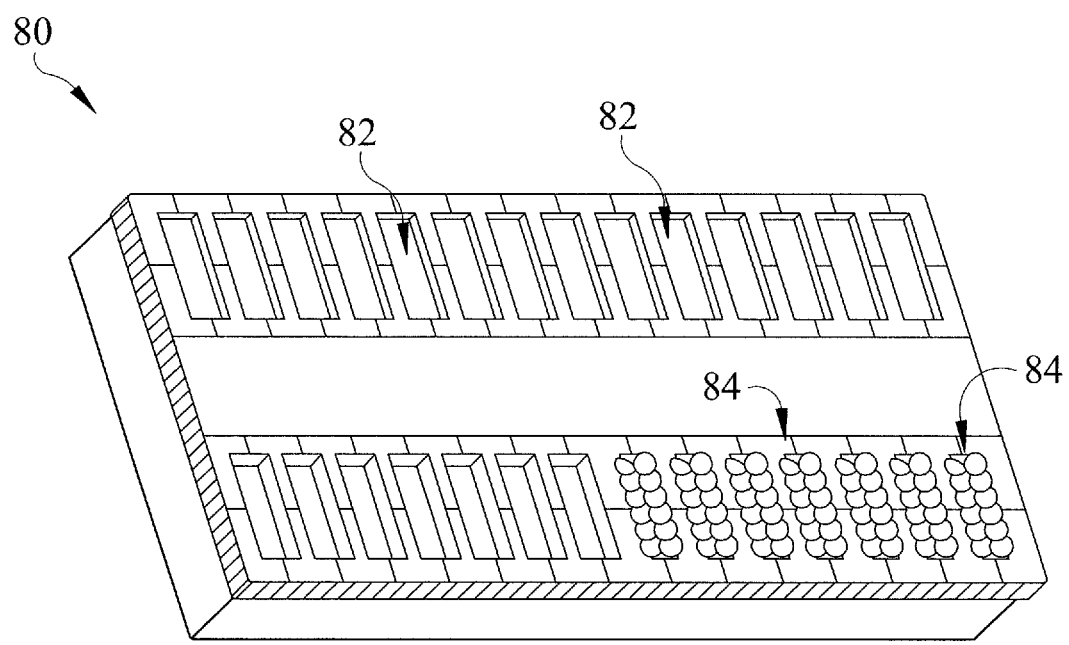
FIG. 7 is a perspective view of a molding block for providing light emitter devices and methods according to aspects of the disclosure herein.

FIG. 7 is an exemplary embodiment of a molding block or tool, generally designated 80. Tool 80 can be used for compression molding of lenses over LED chips, and can comprise one or more multiple molding cavities provided therein. Molding cavities can be configured to encapsulate multiple LED chips and/or provide molded lenses over multiple LED chips at a same time. As FIG. 6 illustrates, different types of molding cavities can be provided per tool 80. For example, one or more flat molding cavities 82 and one or more integrated and distorted dome type cavities 84 can be provided on a same tool 80. Notably, cavities 84 can provide integrally formed and substantially curved or domed lenses over multiple LED chips, where the lenses are distorted in one direction. That is, lenses can be compressed or stretched along one direction, such that a width in that direction is different than a width in at least one other direction, such as an orthogonal direction. At least some of the lenses can be bounded by linear surfaces and curved surfaces as shown and described hereinabove. Notably, the integrally formed and/or distorted and non-flat lenses can contribute to improved brightness, while molding lenses over multiple LED chips at a same processing step can contribute to improved processing times and costs of providing emitter devices described herein.

Light emitter devices and methods provided herein can comprise a luminous flux greater than approximately 2200 lumens (lm), greater than 2300 lm, greater than 2500 lm, or greater than 2600 lm. Light emitter devices and methods provided herein can be used in warm white, neutral white, or cool white lighting applications.

Embodiments as disclosed herein may provide one or more of the following beneficial technical effects: reduced production costs; reduced processing time; improved manufacturability; improved brightness; and improved light extraction, among others.

While the devices and methods have been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein. Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A light emitter device comprising:
   a substrate;
   at least two light emitting diode (LED) chips disposed over the substrate; and
   at least two lenses provided over the substrate and contacting the at least two LED chips, wherein each lens comprises a respective lens base at least partially disposed over the substrate and an apex centrally located with respect to each respective lens base and one or more of the at least two LED chips, wherein at least a portion of at least one of the lenses adjacent another lens is distorted, and wherein each respective lens base at least partially surrounds one or more of the at least two LED chips.

2. The light emitter device according to claim 1, wherein the at least two lenses are integrally formed.

3. The light emitter device according to claim 1, wherein the lenses are both distorted.

4. The light emitter device according to claim 3, wherein the lenses are compressed towards each other.

5. The light emitter device according to claim 1, wherein the portion of the lens distorted is linear.

6. The light emitter device according to claim 1, wherein at least one lens is bounded by one or more linear surfaces and one or more curved surfaces.

7. The light emitter device according to claim 6, wherein the linear surfaces are elevated over the substrate and parallel thereto.

8. The light emitter device according to claim 6, wherein the curved surfaces are disposed directly on the substrate.

9. The light emitter device according to claim 1, wherein at least one lens comprises a dome comprising a first sectional arc and a second sectional arc of different lengths.

10. The light emitter device according to claim 9, wherein the first and second sectional arcs are substantially orthogonal.

11. The light emitter device according to claim 1, wherein at least one of the lenses comprises a first maximum width and a second maximum width, and wherein the first maximum width is smaller than the second maximum width.

12. The light emitter device according to claim 11, wherein the second maximum width comprises a diameter of a sphere.

13. The light emitter device according to claim 1, wherein the at least two LED chips comprise a same color.

14. The light emitter device according to claim 1, wherein the at least two LED chips comprise different colors.

15. The light emitter device according to claim 13, wherein a layer of phosphor is provided over each LED chip.

16. The light emitter device according to claim 1, wherein the substrate comprises a printed circuit board.

17. The light emitter device according to claim 1, wherein the substrate comprises a ceramic material.

18. The light emitter device according to claim 1, wherein at least two traces are provided over the substrate.

19. The light emitter device according to claim 18, wherein at least one of the LED chips is wirebonded to at least one trace.

20. The light emitter device according to claim 1, wherein the at least two LED chips are each provided under a same lens.

21. The light emitter device according to claim 1, wherein each LED chip is provided under a different lens.

22. The light emitter device according to claim 1, further comprising a plurality of LED chips provided in multiple rows.

23. The light emitter device according to claim 22, wherein the rows are staggered in a first direction.

24. The light emitter device according to claim 1, comprising a plurality of hexagonally shaped lenses distorted in portions of the lenses where the lenses are adjacent each other.

25. A light emitter device comprising:
a substrate;
a plurality of light emitting diode (LED) chips disposed over the substrate; and
a plurality of integrally formed lenses provided over the substrate, wherein each lens of the plurality of lenses comprises a lens base at least partially disposed over the substrate and an apex centrally located with respect to the lens base, and wherein each lens completely surrounds one or more of the plurality of LED chips;
wherein a period of each lens is larger than each LED chip, and wherein the plurality of lenses intersect in a plurality of locations along a first direction.

26. The light emitter device according to claim 25, wherein the lenses are compressed in the first direction.

27. The light emitter device according to claim 25, wherein each lens comprises a first maximum width and a second maximum width, wherein the first maximum width is smaller than the second maximum width.

28. The light emitter device according to claim 27, wherein the second maximum width comprises a diameter of a sphere.

29. The light emitter device according to claim 25, wherein each lens is provided over multiple LED chips.

30. The light emitter device according to claim 25, wherein the plurality of LED chips are provided in a square array.

31. The light emitter device according to claim 25, wherein the plurality of LED chips are provided in multiple rows.

32. The light emitter device according to claim 31, wherein the rows are staggered in the first direction.

* * * * *